US005229320A

United States Patent [19]

Ugajin

[11] Patent Number: 5,229,320
[45] Date of Patent: Jul. 20, 1993

[54] METHOD FOR FORMING QUANTUM DOTS

[75] Inventor: Ryuichi Ugajin, Kanagawa, Japan

[73] Assignee: Sony Corporation, Tokyo, Japan

[21] Appl. No.: 920,845

[22] Filed: Jul. 28, 1992

[30] Foreign Application Priority Data

Aug. 2, 1991 [JP] Japan .................... 3-216214
Oct. 31, 1991 [JP] Japan .................... 3-313772

[51] Int. Cl.$^5$ .................. H01L 21/203; G01K 1/08; G21G 25/00; G03C 5/00
[52] U.S. Cl. .................. 437/107; 156/612; 250/398; 250/492.2; 430/296; 430/297
[58] Field of Search .................. 437/107; 156/612; 250/398, 492.2; 430/296, 297

[56] References Cited

U.S. PATENT DOCUMENTS

| | | | |
|---|---|---|---|
| 4,463,265 | 7/1984 | Owen et al. | 250/398 |
| 4,503,447 | 3/1985 | Iafrate et al. | 437/107 |
| 4,575,924 | 3/1986 | Reed et al. | 156/612 |
| 4,761,560 | 8/1988 | Glendinning | 250/492.2 |
| 5,051,598 | 9/1991 | Ashton et al. | 250/492.3 |
| 5,147,823 | 9/1992 | Ishibashi et al. | 437/229 |
| 5,149,975 | 9/1992 | Yoda et al. | 250/398 |
| 5,171,718 | 12/1992 | Ishibashi | 437/229 |

OTHER PUBLICATIONS

Broers et al. "Electron-Beam Fabrication of 80Å Metal Structures" in Appld. Phys. Letters 29(9), 596-598 (1976).

Morrissey et al. "E-Beam Contamination as a Mask" in IBM Technical Disclosure Bulletin 20(6), 2212 (1977).

Primary Examiner—Olik Chaudhuri
Assistant Examiner—Ramamohan R. Paladugu
Attorney, Agent, or Firm—Hill, Steadman & Simpson

[57] ABSTRACT

Disclosed is a method which enabled the precise formation of a group of quantum dots. A device which functions on the principle of a transmission type electron microscope is used to produce a beam of electrons which are passed through a thin crystal membrane in order to produce an electron beam diffraction image. The energy distribution of the diffracted electron beam is used to produce masks, enable epitaxial growth and dry etching involved with the microscopic fabrication operations. For example, a thin GaAs membrane is used to form a diffracted electron beam image on a GaAs layer formed on a substrate. Carbon is then supplied and used to form carbon layers on the the locations where the beam energy is strongest. These carbon layers are used as a mask which allow selective etching of the GaAs layer. An AlGaAs insulating layer is then epitaxially grown on the exposed surface portions of the AlGaAs substrate to fill the spaces between each of the quantum dot defining GaAs portions which project up from the AlGaAs substrate surface.

23 Claims, 9 Drawing Sheets

METHOD FOR FORMING QUANTUM DOTS

BACKGROUND OF THE INVENTION

The present invention relates to a method of forming quantum dots for quantum effect device.

Quantum dots are regions which are sized to shut in electrons of electron quantum mechanical type waves having a wave length in the order of 10 nm. Currently, there is widespread research into devices which include individual quantum dots which are fabricated in semiconductive materials using laser beams and photolithographic technology.

The next generation of such devices however, will not limited to the use of individual quantum dots and will include a plurality of closely grouped dots. Among these new devices which are under investigation are those which use the so called tunnel phenomenon which occurs between this kind of closely grouped quantum dots.

In order to fabricate devices which include lines of closely arranged quantum dots it has been thought to use electron beams and photolithography. In this connection, a work piece has been coated with an organic photoresist which is subject to reaction by an electron bean. This photo resist is patterned via irradiation with a finely focussed electron beam, and the patterning used as a mask for etching via which microscopic fabrication operations are carried out.

However, with this method, the electrons from the irradiated electron beam, scatter within the resist layer which is coated on the work piece, and react therewith. This phenomenon is referred to as a proximity effect.

When using the above type of method, due to the proximity effect, the proximity with which a group of quantum dots can be formed is limited to about 50 nm, and this prevents the desired tunnel effect from being obtained.

An alternate method of forming quantum dots which also uses an electron beam but which is not limited to the previously mentioned resist coating, is such that the resist can be applied by supplying the materials from which the resist is formed, in gaseous form and irradiating the surface of the work piece with the finely focussed electron beam. An example of such a method is disclosed in U.S. Pat. No. 5,171,718 filed in the name of Ishibashi et al.

With the just mentioned type of technology it is possible to achieve a 10 nm degree precision, and as the above mentioned proximity effect is absent, it is possible to form quantum dots in the required proximity of one another.

However, scanning near the peripheral sections of the areas is very difficult and the production of quantum dots on a large scale cannot be improved. Further, as only one electron beam is available for scanning, the formation efficiency of a plurality of quantum dots on a large scale, is poor and an extremely long scanning time is required for the production.

OBJECT AND SUMMARY OF THE INVENTION

In view of the technical drawbacks mentioned above, it is an object of the present invention to provide a method by which groups of closely spaced quantum dots can be simultaneously produced with the required precision.

The quantum dot fabricating method according to the present invention features the use of a crystal layer through which a de Broglie wave can pass and subsequently form a diffraction image. A plurality of quantum dots cam be simultaneously formed by using the diffraction distribution strength of the diffraction image on the surface of the work substrate.

The above mentioned de Broglie wave can take the form of an electron beam, X rays, $\partial$ rays, a neutron beam or the like type of energy wave. The crystal material can be metallic or semiconductive crystalline material. Macro lattices can be formed and include portions of non-crystalline material and/or the like type synthetic materials.

Further, the invention is not limited to the use of a simple single crystal membrane and the diffraction pattern can be obtained using a plurality of membranes or a compound membrane as the situation demands.

Upon the de Broglie wave entering the crystal material, due to the crystal arrangement, the electrons of the wave undergo scattering. With the wave scattered in this manner the relationship between the relative positions of the electrons exhibits a fixed phase difference. A diffraction image is produced via mutual interference. That is to say, the diffraction strength distribution of the de Broglie wave of the electron wave etc., manifests itself and, due to the crystal construction and in accordance with the interference, the diffraction image includes zones of high energy and zones of low energy.

The present invention is such that the specific absorption, dissolution and excitation qualities related with this energy distribution, enable microscopic fabrication operations including mask formation, epitaxial growth and dry etching.

As the dimensions of the quantum dots are essentially the same as the wave lengths of the electrons which pass through the semiconductor crystal (Viz., about 10 nm is good) and as this is much larger than the semiconductor crystal lattice spacing, it is adequate to use a diffraction image with a comparatively low magnification.

Accordingly, with the present invention, it is possible to simultaneously produce batches of microscopically patterned high quality quantum dots. This of course renders it possible to manufacture quantum dot devices with extremely high efficiency.

Further, the crystal material is such that material which is epitaxially grown on a substrate, can be selectively etched. In this case, after a membrane of a crystal material is epitaxially grown on a substrate, it is possible to selectively etch the substrate so that a portion of the membrane through which the de Broglie wave passes is completely exposed and so that it is surrounded by a portion or portions of the substrate which acts as a support. With this arrangement, it is possible to directly mount the membrane on the surface in which the quantum dots are to be formed by way of the supporting portions. This disposition is such that the effect of external vibration on the diffraction pattern image produced, is prevented and it is possible to irradiate for prolonged periods due to the increased stability. The reproducibility of the process is also increased. Further, it is possible to produce crystal diffraction lattices which have large surface areas.

BRIEF DESCRIPTION OF THE DRAWINGS

FIGS. 6a and 6b are schematic elevations showing steps which are involved in forming the quantum dots in accordance with a second embodiment of the present invention, and wherein FIG. 6a shows the condition wherein the electron beam diffraction pattern is formed on an AlGaAs substrate, and FIG. 6b shows GaAs layer which is selectively grown in accordance with the electron beam diffraction pattern;

FIGS. 7a and 7b are schematic elevations showing steps which are involved in forming the quantum dots in accordance with a third embodiment of the present invention, and wherein FIG. 7a shows the state wherein the electron beam diffraction pattern image is formed on the GaAs substrate and FIG. 7b shows the substrate selectively etched in accordance with the electron beam diffraction pattern;

DETAILED DESCRIPTION OF THE INVENTION

The present invention will now be disclosed with reference to the drawings in which the preferred embodiments of the same, are shown.

Figure 1:
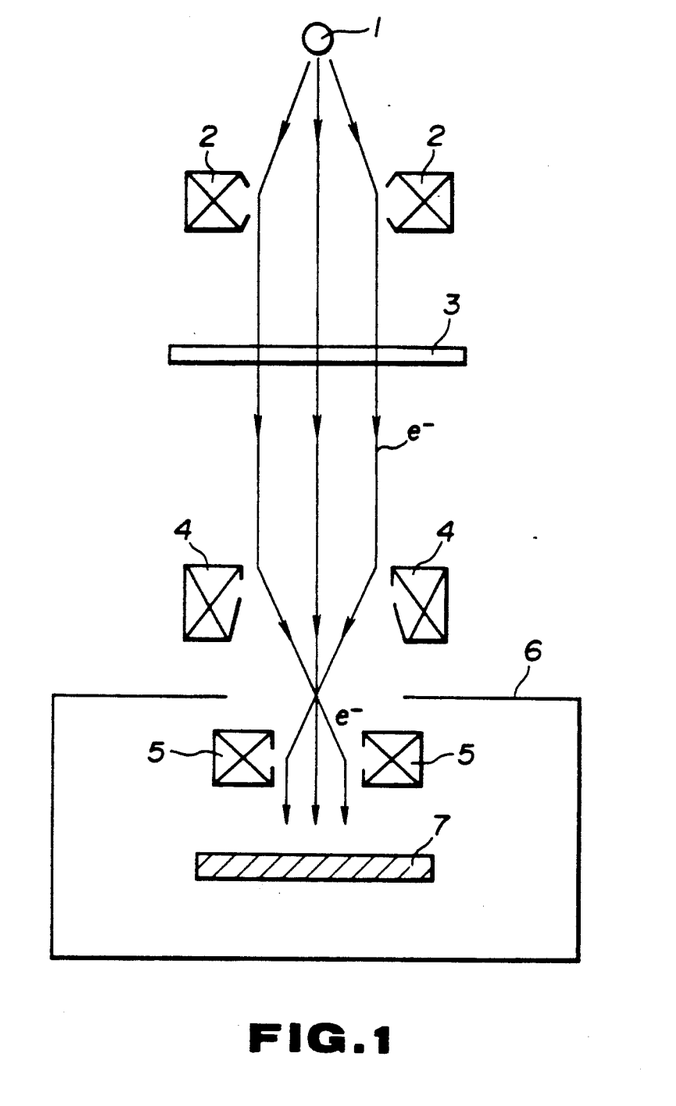
FIG. 1 schematically depicts an electron beam device used in connection with the formation of the quantum dots according to first-third embodiments of the present invention.

First, the electron beam diffraction device which is used in connection with the first-third embodiments of the present invention is shown in FIG. 1.

As schematically shown in FIG. 1, this arrangement is an electron beam diffraction device which functions on the same principle as a transmission type electron microscope (TEM). That is to say, an electron beam (e⁻) which is emitted from an electron source 1, transmitted by way of a collimating lens 2 to a thin crystalline GaAs membrane 3. This thin crystalline GaAs membrane 3 is that, in order for the electron beam to pass therethrough, the electrons, which are scattered, give rise to mutual interference. The electron beam which is grouped by a diffraction figure(s) formed on the membrane 3, is then passed through an object lens 4 and then an incidence lens 5 which is disposed in a specimen chamber 6 and onto a wafer 7.

The magnification of the diffraction image(s) is determined by the objective and incidence lenses 4, 5. In this connection, the instant electron beam diffraction device can use a magnification which is small when compared with that of normal electron microscopes. By way of example, if the lattice spacing of the thin GaAs membrane is "a", and the period of the quantum dots is na (wherein n is natural number), then it is acceptable to set the magnification at n times.

With this type electron diffraction device, it is possible using the diffraction figure(s) on the thin GaAs membrane 3, to form microscopic pattern masks, grow epitaxial layers and etch the same. The actual production steps involved in the fabrication of the various embodiments will now be set forth in detail with reference to FIGS. 2-5.

Figure 2:
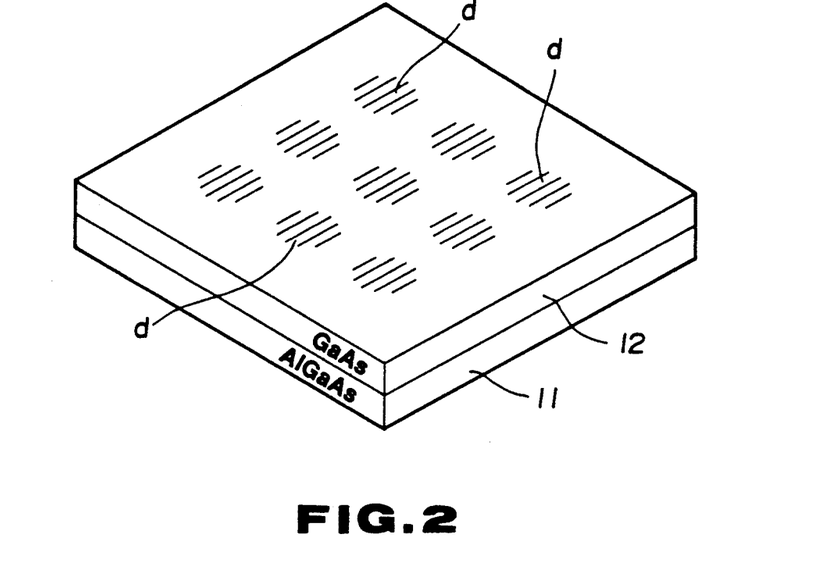
FIG. 2 is a schematic perspective view which shows the manner in which an electron beam diffraction pattern image is formed on a GaAs epitaxial layer.
Figure 3:
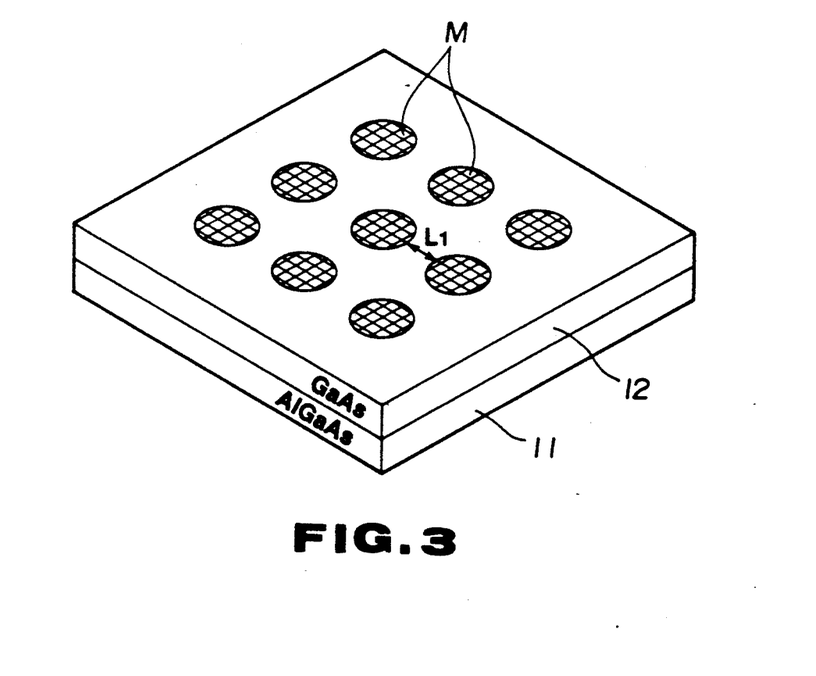
FIG. 3 is a schematic perspective view which shows the manner in which a carbon mask pattern is formed on the above mentioned diffraction pattern.
Figure 4:
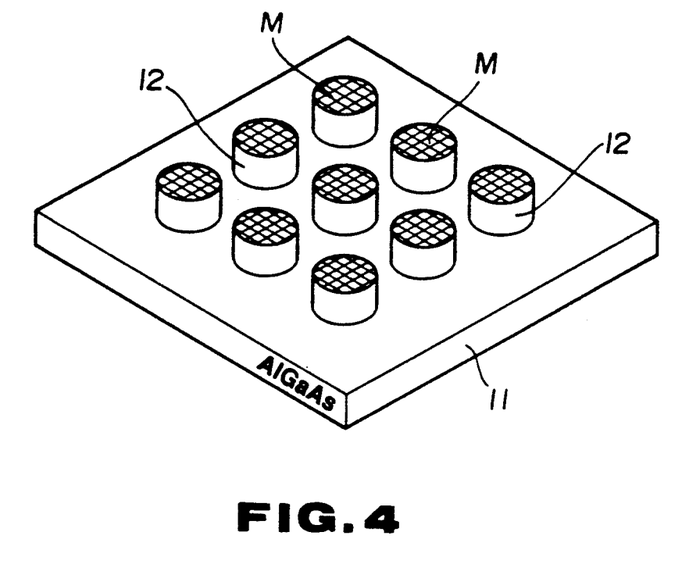
FIG. 4 is a schematic perspective view which shows the GaAs layer after etching using the carbon mask pattern shown in FIG. 3 as a mask.

First, a AlGaAs layer 11 is formed on either a AlGaAs or a GaAs substrate. Following this, a GaAs layer 12 is epitaxially grown on the thus prepared wafer. The thickness of this GaAs layer matches the height of the quantum dots.

This wafer is set in a specimen chamber 6 of an electron diffraction device of the nature illustrated in FIG. 1. Under these conditions, an electron beam e⁻ is generated, caused to undergo diffraction as it passes through the thin GaAs membrane 3, and used to irradiate the wafer set in the chamber 6. This results in the diffraction pattern d being formed on the upper surface of the GaAs layer in accordance with the diffraction figure formed in the GaAs layer 3. This diffraction pattern d is such as to result in the diffracted ray strength distribution, which is induced by the crystal diffraction of the GaAs layer 3, being distributed to form a periodically arranged pattern of the nature shown in FIG. 2.

After the diffraction pattern D image is formed on the upper surface of the GaAs layer 12, a small amount of carbon is introduced into the specimen chamber 6. This carbon adheres to the zones on the upper surface of the GaAs layer 12 where the diffraction forming electron energy has been absorbed. This results in the carbon masks patterns M shown in FIG. 3. The spacing $L_1$ with which the diffraction pattern d influenced mask pattern M is arranged, can be selected within the range of 50-200 Å depending on the manner in which the magnification n is selected.

Following the formation of the carbon mask pattern, etching is carried out either in the above mentioned specimen chamber 6 or in a separate etching device. This etching can be carried out using RIE (reaction type ion etching) by way of example, and is such as to remove the portions of the GaAs layer which are not covered with the carbon mask pattern M. This results in the arrangement depicted in FIG. 4.

Figure 5:
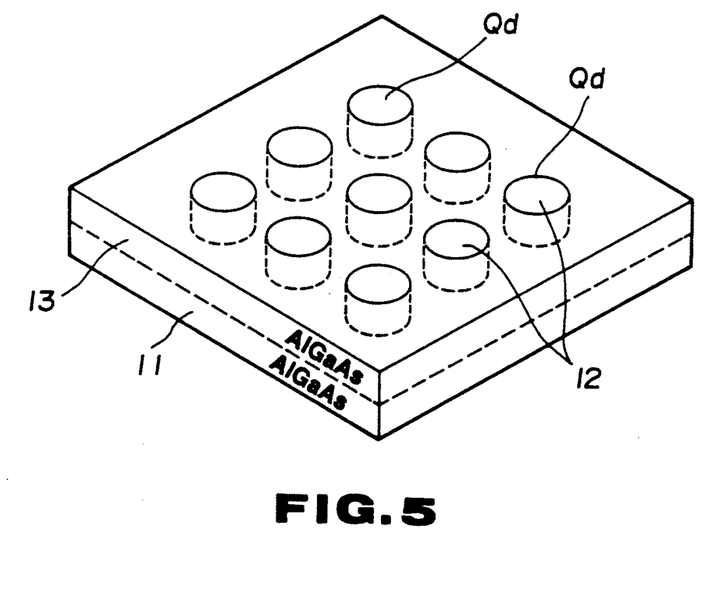
FIG. 5 is a schematic perspective view showing a AlGaAs layer which has been grown around the portions of the GaAs layer which remain after the above mentioned etching.

When the complete etching is finished, the carbon mask pattern is removed and a AlGaAs layer 13 is formed over the exposed portions of the AlGaAs layer 11 via epitaxial growth. The result of this is that, as shown in FIG. 5, a plurality of quantum dots Qd are formed in the positions which were marked out with the carbon mask pattern. Each of the dots are mutually insulated from one another by the AlGaAs layer 13.

Second Embodiment

This embodiment is described with reference to FIGS. 6a and 6b and utilizes a quantum dot formation process wherein the quantum dots are formed via an electron beam diffraction pattern influenced epitaxial growth.

Figure 6A:
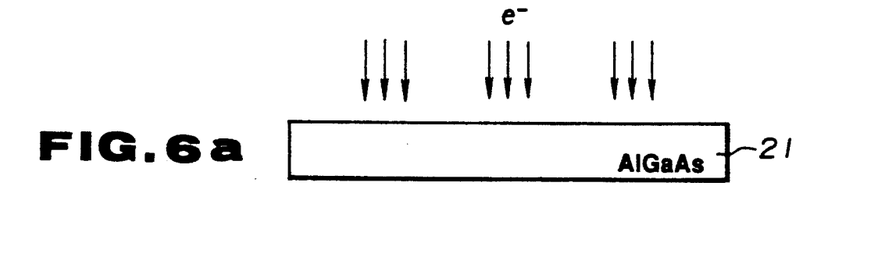
Figure 6B:
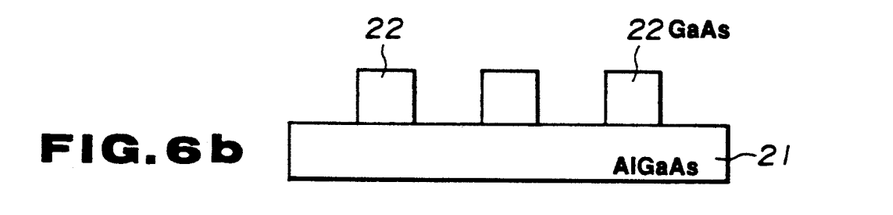

First, the ion beam diffraction device of FIG. 1 is used in the manner schematically shown in FIG. 6a, to form an image on the upper surface of a AlGaAs substrate 21 using the electron beam which passed through the thin GaAs membrane 3. Under these conditions, material in the form of trimethyl gallium and trimethyl arsenic gas, is introduced into the specimen chamber 6. Subsequently, the electron beam energy decomposes the gases and GaAs layer 22 are selectively developed via epitaxial growth in the path of the electron beams in the manner illustrated in FIG. 6b.

Although not shown in the figures, after the epitaxial growth of the GaAs layers 22 in the zones defined by the diffraction pattern, an insulating AlGaAs layer is formed on the upper surface of the AlGaAs substrate 21 in the areas which are not covered with the GaAs layers 22, via epitaxial growth. This defines the quantum dots.

Third Embodiment

The third embodiment of the invention is such that the diffraction pattern is used in combination with dry etching. This process will now be explained with reference to FIGS. 7a and 7b.

First, a GaAs substrate 31 on which the quantum dots are to be formed, is set in the specimen chamber 6 of the electron beam diffraction device shown FIG. 1. Etching gas is then introduced into the specimen chamber 6 and is absorbed by the upper surface of the GaAs substrate 31.

Figure 7A:
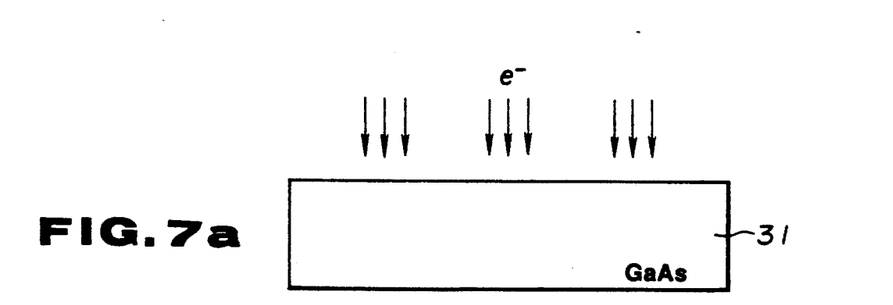

Next, similar to the first and second embodiments, the electron diffraction device is used as schematically shown in FIG. 7a, so that the diffracted electron beams which pass through the GaAs layer 3, produce an image on the upper surface of the GaAs substrate 31.

Figure 7B:
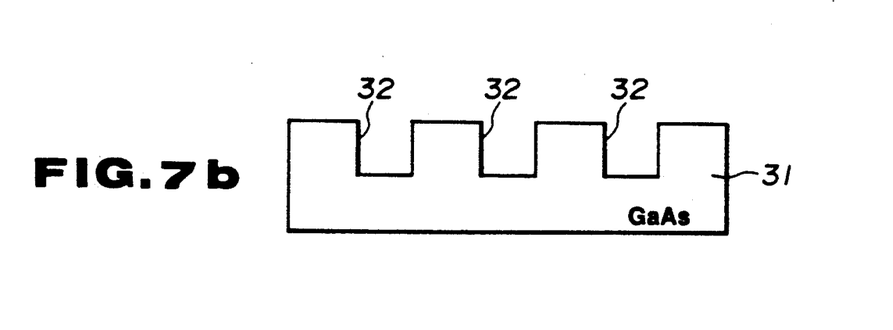

Subsequently, as shown in FIG. 7b, the zones wherein the diffraction strength is strong, selectively absorb the electron beam energy and become excited. This result in the GaAs substrate being etched and the formation of the microscopic bores 32 in accordance with the diffraction pattern.

After this, the interiors of the microscopic bores 32 can have GaAs of a different band gap size material, epitaxially grown therein to define the quantum dots.

Fourth Embodiment

In accordance with this embodiment, an adnation type crystal diffraction lattice unit is formed using electron beam irradiation and attached to a wafer. This unit is used to form the quantum dots. The process via which this is carried will be disclosed with reference to FIGS. 8-12.

Figure 8:
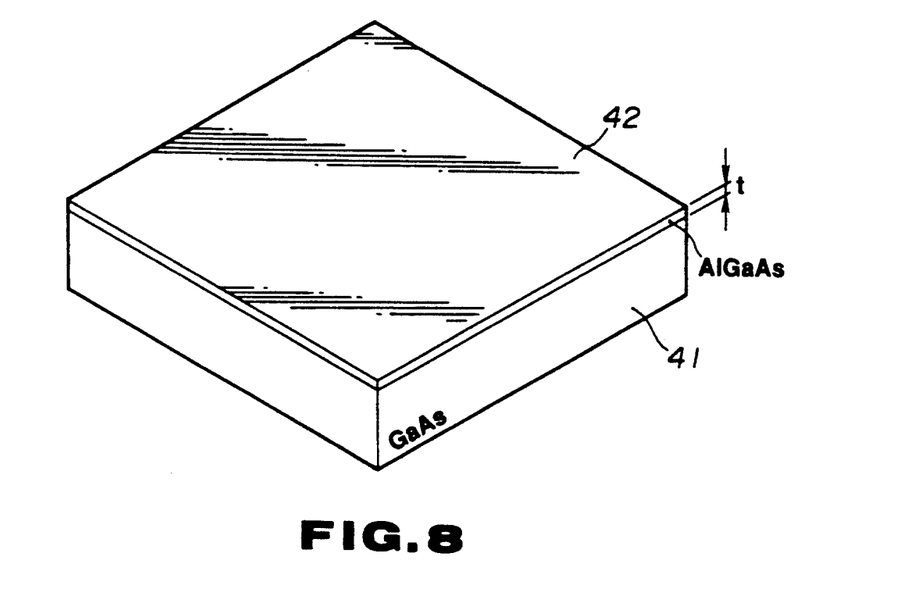
FIG. 8 shows the state wherein a AlGaAs membrane is epitaxially grown on one side of a GaAs substrate in accordance with a fourth embodiment of the present invention.

First, as shown in FIG. 8, a AlGaAs membrane 42 is formed on a GaAs substrate 41 using a MOCVD type epitaxial growth technique. The size of the GaAs substrate 41 is selected to be the same as that of the crystal lattice. Further, in this embodiment the thickness of the GaAs substrate is selected in accordance with the distance from the surface in which the quantum dots are to be formed that the crystal diffraction lattice should be supported. The thickness t of the AlGaAs membrane 42 is selected to be in the order of several tens of Å and such that the electron beam which passes therethrough will be diffracted.

Following this, a resist layer 43 is formed on a side of the GaAs substrate opposite to that on which the AlGaAs membrane is attached. This resist layer 43 has an essentially inverted U-shape and is formed along three edges of the GaAs substrate in the manner shown in FIG. 9.

Figure 9:
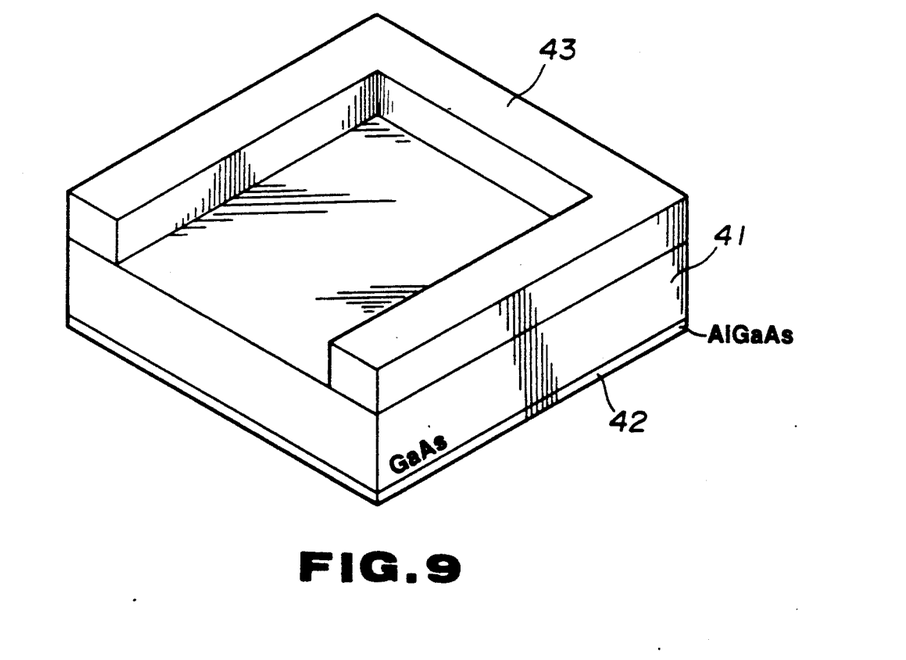
FIG. 9 is a schematic perspective view which shows the state wherein a resist pattern is formed on a reverse side of the GaAs substrate.

Next, etching is carried out using the resist layer 43 as a mask until the GaAs membrane 41 is removed. This etching can be carried out using Cl or F class etchant using a RIE (reaction ion etching) technique. At this etching stage the surface of the AlGaAs membrane 42 which is below the GaAs layer 41 includes projections. This surface which includes projections is coated with a low vapor pressure AlF$_3$ which exhibits highly selective protective characteristics with respect to the AlGaAs membrane 42.

Figure 10:
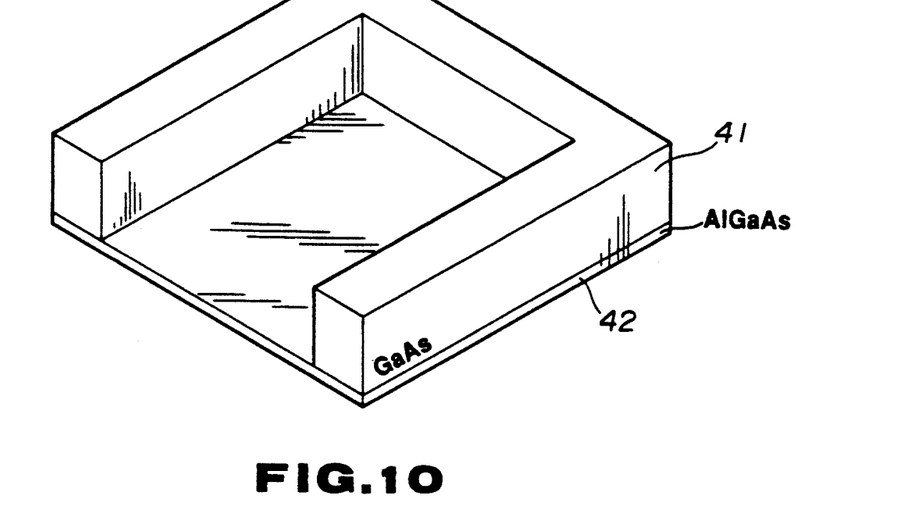
FIG. 10 shows the GaAs substrate which has been selectively etching using the resist pattern to leave a crystal diffraction lattice.

After this, the resist layer 43 is removed thus completing the crystal diffraction lattice as depicted in FIG. 10. The inverted U-shape pattern into which the GaAs substrate is formed, serves as a support for the crystal diffraction lattice.

Figure 11:
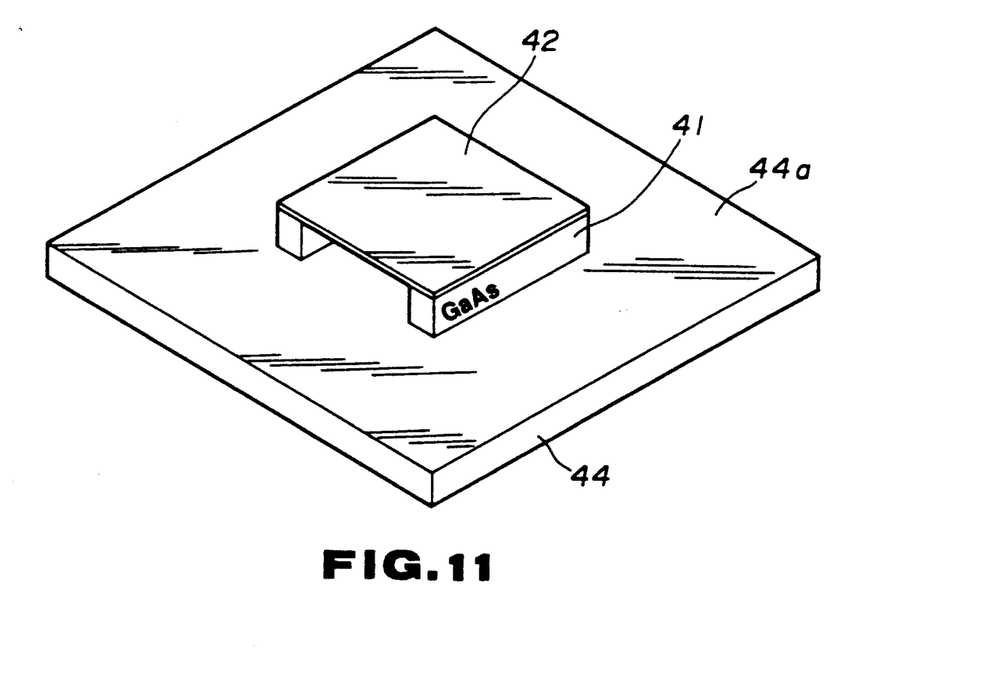
FIG. 11 is a perspective view showing the above mentioned crystal diffraction lattice disposed on a process material substrate.

Next, the inverted U-shaped GaAs substrate 41 is placed in contact with a surface 44a of a processing material substrate 42 in which quantum dots are to be formed, in the manner depicted in FIG. 11. Under these conditions, the spacing with which the AlGaAs membrane 42 which forms the diffraction image(s), is maintained from the surface 44a, is determined by the thickness of the GaAs substrate 41.

With this arrangement even if vibration should be applied to the processing material substrate 44, as the crystal diffraction lattice is supported by the GaAs substrate 41, the relative positions of the crystal diffraction lattice and the processing material substrate 44 do not change. The effect of this is to stabilize the diffraction pattern and to improve the reproducibility of the process. It also renders it possible to irradiate using the electron beam for long periods of time.

Figure 12:
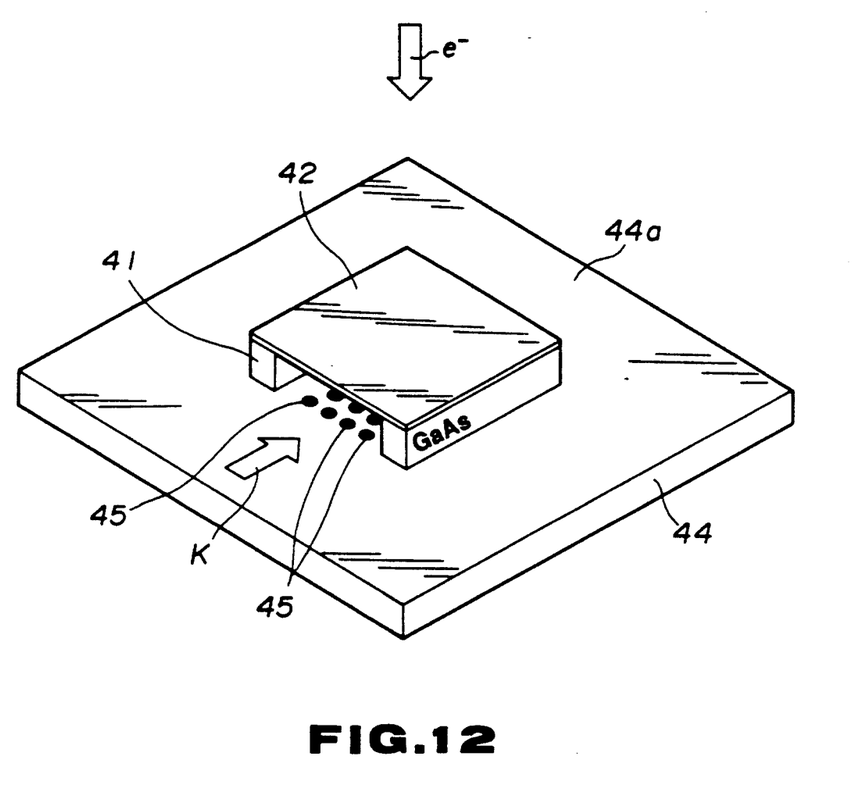
FIG. 12 is a perspective which shows the above mentioned crystal diffraction lattice being used to form quantum dot images on the process material substrate.

Under these conditions, as shown in FIG. 12, the AlGaAs membrane 42 which is exposed to the electron beam e— irradiation, induces the formation of an electron diffraction pattern image 45 on the surface 44a of the processing material substrate 44. At this time, as an opening is formed in the GaAs substrate 41, carbon, etching gas etc., can be introduced in the manner indicated by the bold arrow K, and a mask can be formed in accordance with the diffraction image pattern 45, epitaxial growth, dry etching and the like can be carried out. In other word, it is not necessary to remove the GaAS substrate and it can be left in contact with the processing material substrate 44 enabling stable microscopic fabrication steps to be carried out.

Fifth Embodiment

Figure 13:
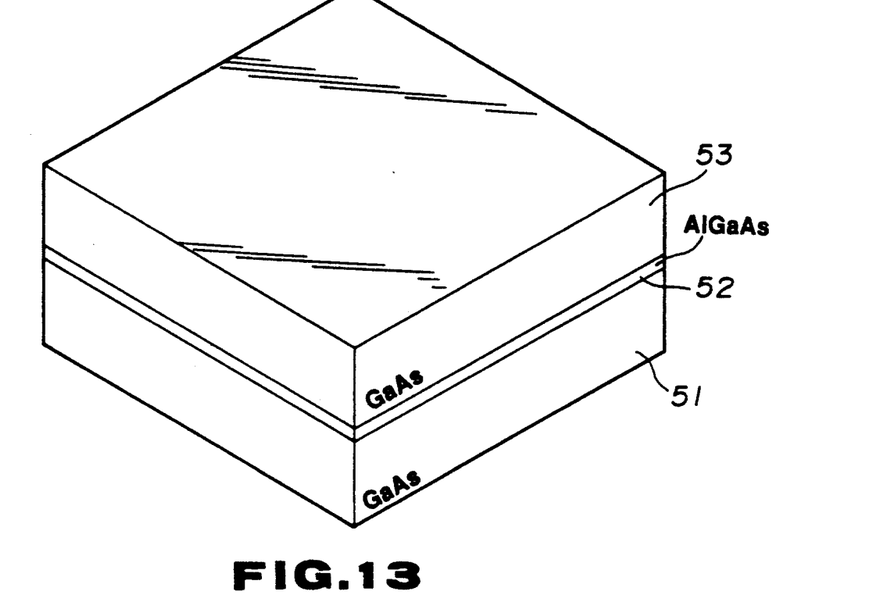
FIG. 13 is a perspective view which shows a AlGaAs membrane and GaAs layer which are epitaxially grown on GaAs substrate in accordance with a fifth embodiment of the present invention.

This embodiment is a variation of the forth embodiment and features the formation of GaAs layers on both sides of the AlGaAs membrane. This increases the rigidity with which the diffraction lattice is supported when it is used for the formation of quantum dots.

As shown in FIG. 13, firstly, a AlGaAs membrane 52 is expitaxially grown on the surface of GaAs substrate 51. The thickness of this membrane is in the order of 10 nm—a given number of nm thick so as to provide the required crystal characteristics.

Further, in this embodiment a GaAS layer 53 is formed on the upper surface of the AlGaAs membrane 52. As will become apparent later, during fabrication this GaAs layer 53 provides a framework which increases the mechanical strength of the arrangement.

Figure 14:
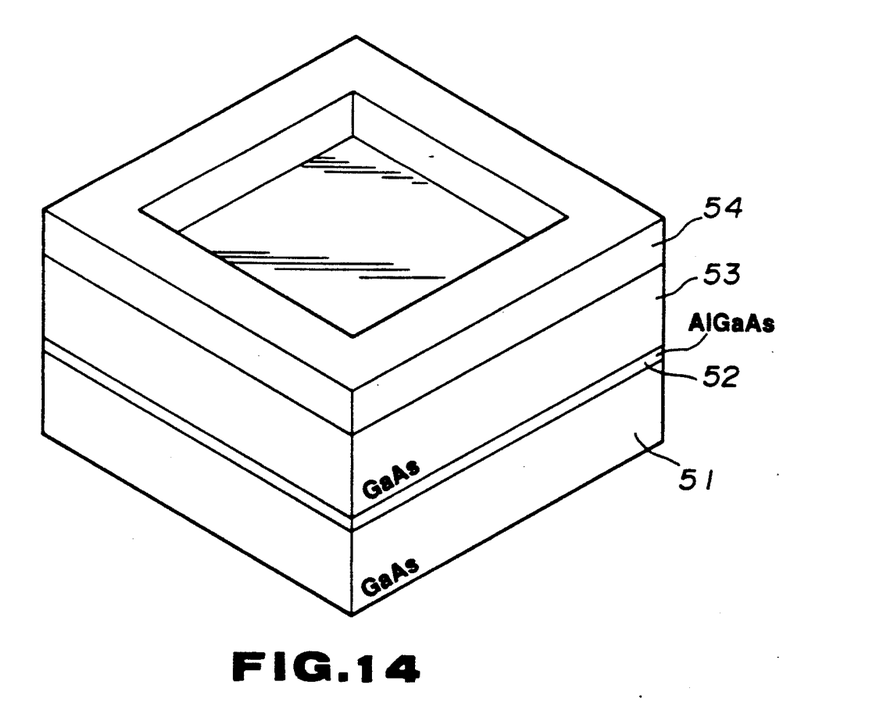
FIG. 14 is a perspective view showing a resist pattern selectively formed on the upper surface of the GaAs substrate.

Next, a resist layer 54 is formed on the GaAs layer 53. As shown in FIG. 14, this resist layer 54 is patterned so as to extend about the four edges of the GaAs layer 53.

After this, the resist layer 54 is used as a mask and RIE is carried out. This etching uses Cl or F type etchant. As a result of this etching, the surface of AlGaAs membrane 52 becomes rough and AlF₃ is used as an etching stopper.

Figure 15:
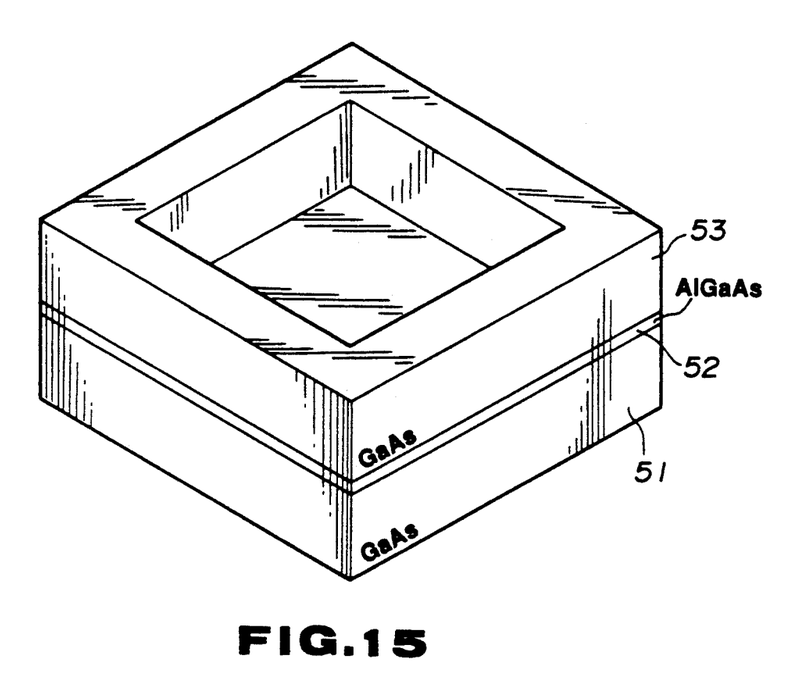
FIG. 15 is a perspective view which shows the GaAs layer selectively etched using the resist pattern and with said resist pattern removed.

When the etching is completed, the resist layer 54 is removed and the arrangement illustrated in FIG. 15 is obtained.

Figure 16:
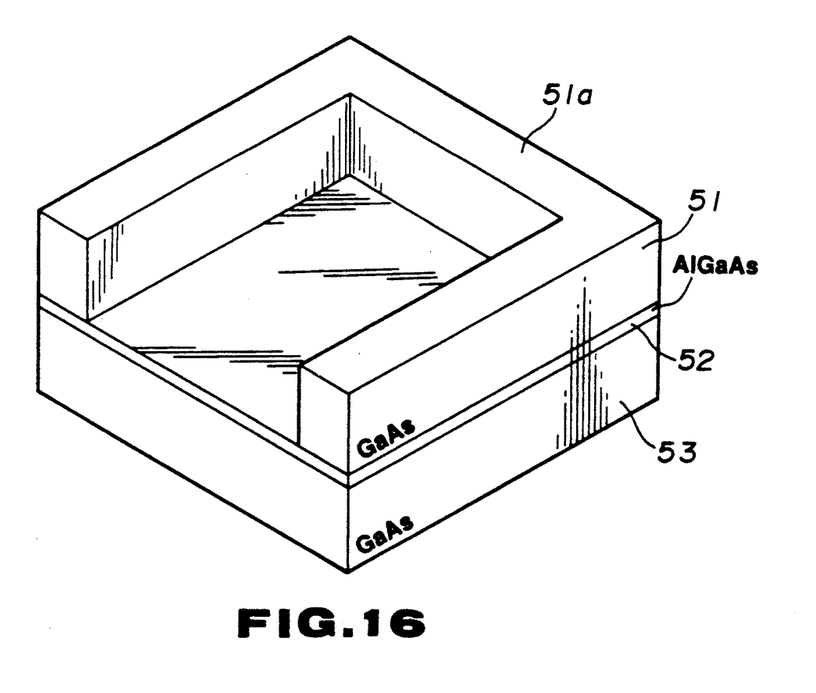
FIG. 16 is a perspective view which shows the GaAs substrate etched using a similar type of resist patterning.

After this, the same resist/etching techniques are used on the GaAs layer 51 to form a support member which extends around three sides of the AlGaAs layer 52 and has an opening into which carbon and etchant gas can be introduced and supplied to the surface of the processing material substrate on which the diffraction pattern image is projected.

Other than this the process is the same as disclosed in connection with the fourth embodiment and the GaAs substrate is placed on the surface of a processing material substrate and exposed to irradiation by an electron beam. The electron beam diffraction pattern image which is formed is used to form mask patterns and to control etching and the like as disclosed in connection with earlier embodiments.

With the crystal diffraction lattice of the instant embodiment, as the AlGaAs layer is supported on both sides by the GaAs substrate 51 and the GaAs layer 53, the mechanical rigidity of the arrangement is increased. As a result, as the lattice supported on the substrate on which fabrication operations are being carried out, any problems which tends to stem from vibration on the formation of the diffraction pattern is even further reduced.

It will of course be appreciated that the present invention is not limited to the above described five embodiments and it is possible within the scope of the present invention that X rays or the like type of energy waves be used in place of the above described electron beam diffraction.

Further, in connection with the energy irradiation of the substrate, the gases which can be used can be varied in order to provide selective effects and/or from various types of material. For example, in connection with the first embodiment, the mask material is not limited to carbon and other organic or inorganic materials can be used. In the case of inorganic materials it is possible to use silane type gas with oxygen in order to form a silicon oxide layer membrane. Alternatively, a tungsten metallic mask can be formed by introducing a flurotungsten gas.

In the case the work piece takes the form of a semiconductor, for example a chemical compound type semiconductor and the substrate is made of a material the etching of which can be controlled to a desired ratio, it is possible to use a different compound type semiconductor as a mask.

In the same manner the second embodiment is such that if a given type of layer is formed on a fabrication substrate and the quantum dots can also be formed in this particular layer, it is feasible to prepare a different compound semiconductor or use different semiconductive or metallic material layers.

Further, the size of the crystal lattice described in connection with the fourth and fifth embodiments, it is possible to select the sizes to vary in the order of a number of mm to a number of cm.

What is claimed is

1. A method of forming quantum dots comprising:
   forming a diffraction image on a fabrication substrate by passing a de Broglie wave through a thin crystal material membrane; and
   forming a plurality of quantum dots at predetermined locations on the surface of said fabrication substrate in accordance with the distribution strength of the diffraction image.

2. A method of forming quantum dots as set forth in claim 1 further comprising the steps of:
   forming said thin crystal material membrane on a substrate using epitaxial growth;
   etching said substrate so that it assumes a predetermined configuration which can be fixed on said fabrication substrate; and
   supporting said thin crystal material membrane on said fabrication substrate using the etched substrate and using said crystal material membrane to project said diffraction image on said fabrication substrate.

3. A method of forming quantum dots as set forth in claim 1 wherein said de Broglie wave is one of an electron beam, an X ray, a neutron beam and a proton beam.

4. A method of forming quantum dots as set forth in claim 1 wherein said thin crystal material membrane is formed from a compound semiconductive material.

5. A method of forming quantum dots as set forth in claim 1 wherein said fabrication substrate is formed from a compound semiconductive material.

6. A method of forming quantum dots comprising:
   projecting a diffraction image on a fabrication substrate using a thin crystal material membrane and passing a de Broglie wave therethrough;
   selectively forming a mask on a predetermined site of said fabrication substrate using the strength distribution of said diffraction image;
   using said mark to etch said fabrication substrate so that a group of quantum dots are defined.

7. A method of forming quantum dots as set forth in claim 6 wherein said thin crystal material membrane is formed from a compound semiconductive material.

8. A method of forming quantum dots as set forth in claim 6 wherein said de Broglie wave is one of an electron beam, an X-ray, a neutron beam and a proton beam.

9. A method of forming quantum dots as set forth in claim 6 wherein said fabrication substrate is formed from a compound semiconductive material.

10. A method of forming quantum dots comprising:
    projecting a diffraction image on a GaAs layer by passing an electron beam through a thin GaAs membrane;
    using the strength distribution of the diffraction image to form carbon layers on predetermined locations of the surface of the GaAs layer; and using the carbon layer as a mask and etching said GaAs layer to form a plurality of quantum dots.

11. A method of forming quantum dots comprising:
epitaxially growing a thin AlGaAs membrane on the upper surface of a GaAs substrate;
forming a support member from said GaAs substrate;
fixing the support member to a fabrication substrate;
passing an electron beam through said thin AlGaAs membrane to form a diffraction image on the fabrication substrate;
forming carbon layers on predetermined portions of the surface of said fabrication substrate using the diffraction strength distribution; and
using the carbon layers as masks and etching the fabrication substrate to form a plurality of quantum dots.

12. A method of forming quantum dots comprising:
forming a diffraction image on a surface of fabrication substrate by passing a de Broglie wave through a thin crystal material membrane;
using the energy of the de Broglie wave to selectively decompose an organo-metallic compound and induce the epitaxial growth of a plurality of semi conductive chemical compound quantum dot defining layers in accordance with the diffraction strength distribution of the de Broglie wave which occur at predetermined portions of the fabrication substrate surface.

13. A method of forming quantum dots as set forth in claim 12 wherein said thin crystal material membrane is formed from a compound semiconductive material.

14. A method of forming quantum dots as set forth in claim 12 wherein said de Broglie wave is one of an electron beam, an X ray, a neutron beam and a proton beam.

15. A method of forming quantum dots as set forth in claim 12 wherein said fabrication substrate is formed from a compound semiconductive material.

16. A method of forming quantum dots comprising:
projecting a diffraction image onto a AlGaAs layer by passing an electron beam through a thin GaAs membrane;
using the energy of the electron beam, to selectively decompose an organo-metallic compound and induce the epitaxial growth of a plurality of semi conductive chemical compound quantum dot defining layers in accordance with the diffraction strength distribution of the electron beam which occur at predetermined portions of the AlGaAs layer surface.

17. A method of forming quantum dots comprising:
epitaxially growing a thin AlGaAs membrane on a GaAs substrate;
forming a support member from said GaAs layer and securing the support member to a surface of a fabrication substrate;
passing an electron beam through said thin AlGaAs membrane to form a diffraction image which is projected onto the surface of said fabrication substrate;
using the energy of the electron beam, to selectively decompose an organo-metallic compound and induce epitaxial growth of a plurality of semi conductive chemical compound quantum dot defining layers in accordance with the diffraction strength distribution of the electron beam which occur at predetermined portions of the AlGaAs layer surface.

18. A method of forming quantum dots comprising:
forming a diffraction image on a surface of fabrication substrate by passing a de Broglie wave through a thin crystal material membrane while exposing said surface of said fabrication substrate to an etching gas; and
using the energy of the de Broglie wave to selectively etch said fabrication substrate in accordance with the diffraction strength distribution of the de Broglie wave which occur at predetermined portions of the fabrication substrate surface.

19. A method of forming quantum dots as set forth in claim 18 wherein said thin crystal material membrane is formed from a compound semiconductive material.

20. A method of forming quantum dots as set forth in claim 18 wherein said de Broglie wave is one of an electron beam, X ray, a neutron beam and a proton beam.

21. A method of forming quantum dots as set forth in claim 18 wherein said fabrication substrate is formed from a compound semiconductive material.

22. A method of forming quantum dots comprising:
forming a diffraction image on a surface of a GaAs substrate by passing an electron beam through a thin GaAs membrane while exposing said surface of said GaAs substrate to an etching gas; and
using the energy of the electron beam to selectively etch said GaAs substrate in accordance with the diffraction strength distribution of the electron beam which occur at predetermined portions of the GaAs substrate surface.

23. A method of forming quantum dots comprising:
epitaxially growing a thin AlGaAs membrane on a GaAs substrate;
forming a support member from said GaAs layer and securing the support member to a surface of a fabrication substrate;
passing an electron beam through said thin AlGaAs membrane to form a diffraction image which is projected onto the surface of said fabrication substrate while the surface is exposed to an etching gas; and
using the energy of the electron beam to excite the etching gas and selectively etch said fabrication substrate in accordance with the diffraction strength distribution of the electron beam which occurs at predetermined portions of the fabrication substrate surface.

* * * * *